United States Patent
Odame et al.

(10) Patent No.: US 11,984,861 B2
(45) Date of Patent: May 14, 2024

(54) FAST AMPLITUDE DETECTOR AND AUTOMATIC GAIN CONTROL

(71) Applicant: THE TRUSTEES OF DARTMOUTH COLLEGE, Hanover, NH (US)

(72) Inventors: Kofi Odame, Hanover, NH (US); Yueh-Ching Teng, Lebanon, NH (US)

(73) Assignee: THE TRUSTEES OF DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 18/116,755

(22) Filed: Mar. 2, 2023

(65) Prior Publication Data
US 2023/0208373 A1 Jun. 29, 2023

Related U.S. Application Data

(63) Continuation of application No. 16/067,539, filed as application No. PCT/US2017/012186 on Jan. 4, 2017, now abandoned.

(60) Provisional application No. 62/275,040, filed on Jan. 5, 2016.

(51) Int. Cl.
*H03G 3/30* (2006.01)
*H03F 3/24* (2006.01)

(52) U.S. Cl.
CPC ............ *H03G 3/3036* (2013.01); *H03F 3/24* (2013.01)

(58) Field of Classification Search
CPC ................................ H03G 3/3036; H03F 3/24
See application file for complete search history.

(56) References Cited

U.S. PATENT DOCUMENTS

| | | | | |
|---|---|---|---|---|
| 5,093,635 A * | 3/1992 | Kasperkovitz | ........... | H03B 5/20 331/109 |
| 5,602,469 A * | 2/1997 | Fujii | .................. | G01R 19/0053 324/76.77 |
| 6,195,132 B1 * | 2/2001 | Kimura | ..................... | H04N 5/21 348/622 |
| 7,013,117 B2 * | 3/2006 | Darabi | .................... | H04B 1/406 375/345 |
| 8,050,638 B2 * | 11/2011 | Vinayak | ..................... | H03F 1/32 455/240.1 |
| 2009/0261589 A1 * | 10/2009 | Oohara | .................. | F03D 7/0284 290/44 |
| 2012/0217980 A1 * | 8/2012 | Pausini | .................. | G01R 29/26 324/613 |

(Continued)

OTHER PUBLICATIONS

Oh et al. (2007) "Multi-frequency EIT system with radially symmetric architecture: Khu Mark11" Physiol. Meas. 28, pp. S183-S196.

(Continued)

*Primary Examiner* — Jaison Joseph
(74) *Attorney, Agent, or Firm* — Cozen O'Connor

(57) ABSTRACT

An amplitude detector has a phase shifter such as one using an analog differentiator and an adjustable gain stage, or one using a determinable delay, the phase shifter coupled to shift phase of an input signal to the amplitude detection apparatus. The detector also has a first analog multiplier coupled to square the input signal, a second analog multiplier coupled to square output of the phase shifter; and an analog adder coupled to sum outputs of the first and second analog multiplier. An automatic gain control circuit has the amplitude detector coupled to control gain of a controllable amplifier.

7 Claims, 4 Drawing Sheets

(56) References Cited

U.S. PATENT DOCUMENTS

| | | | |
|---|---|---|---|
| 2013/0127529 A1* | 5/2013 | Morita | H03G 3/20 |
| | | | 330/124 R |
| 2014/0084700 A1* | 3/2014 | Anderson | H03F 1/565 |
| | | | 307/104 |
| 2015/0194942 A1* | 7/2015 | Anderson | B82Y 40/00 |
| | | | 330/297 |
| 2016/0218757 A1* | 7/2016 | Zuckerman | H04B 1/1036 |
| 2017/0077877 A1* | 3/2017 | Anderson | H03F 1/0261 |

OTHER PUBLICATIONS

International Search Report and Written Opinion of PCT/US17/12186, dated Mar. 17, 2017, 7 pp.

International Preliminary Report on Patentability of PCT/US17/12186, dated Jul. 10, 2018, 6 pp.

* cited by examiner

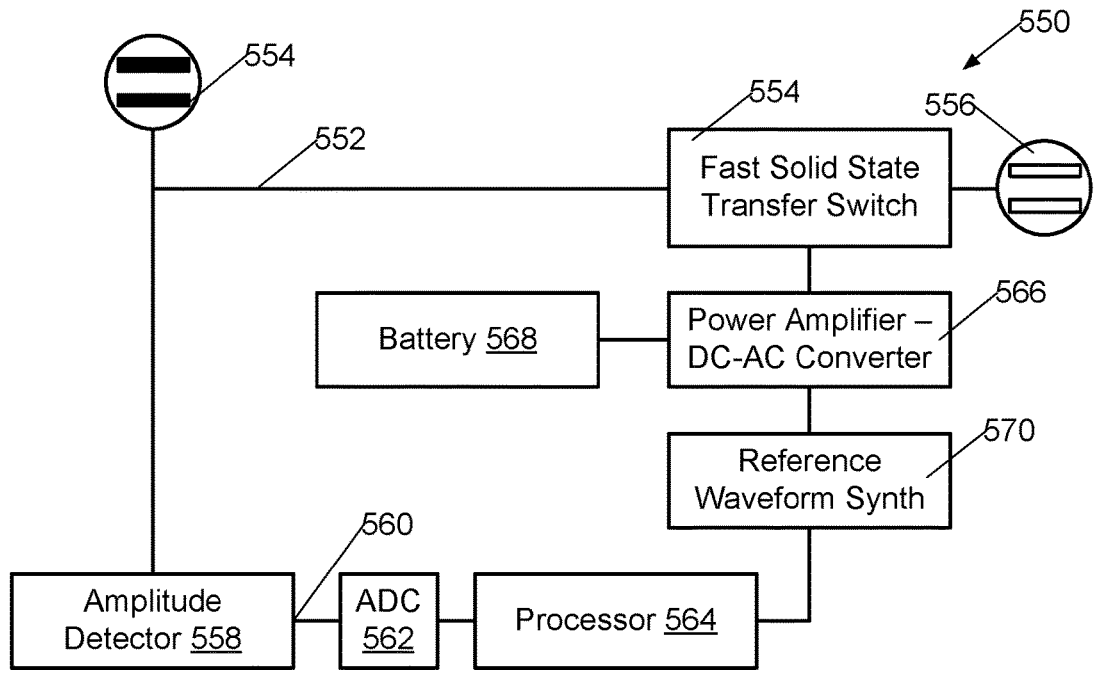
FIG. 5
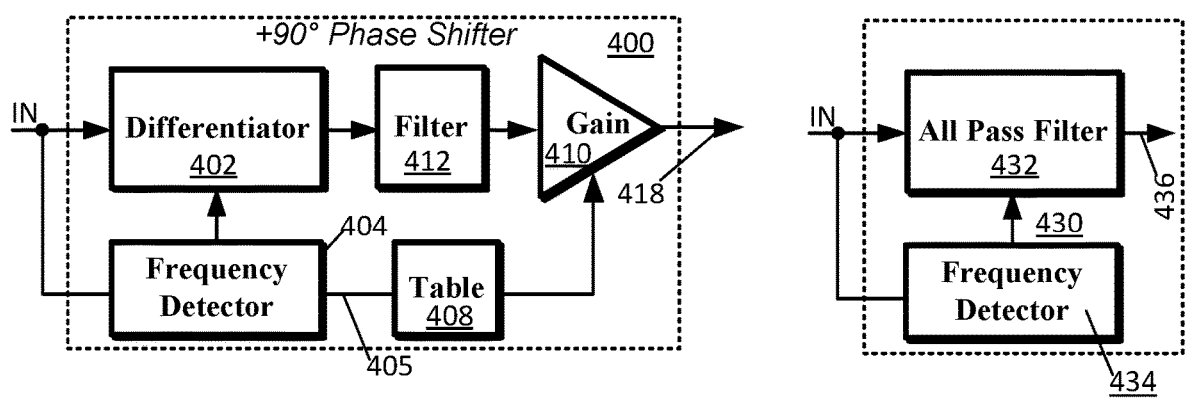
FIG. 4A
FIG. 4B

FAST AMPLITUDE DETECTOR AND AUTOMATIC GAIN CONTROL

CROSS-REFERENCE TO RELATED APPLICATIONS

This application claims the benefit of priority to U.S. Patent Application Ser. No. 62/275,040, filed Jan. 5, 2016, which is incorporated herein by reference in its entirety.

FEDERAL FUNDING

This invention was made with government support under grant IIS-1418497 awarded by the National Science Foundation. The government has certain rights in the invention.

BACKGROUND

Amplitude detectors are ubiquitous in radio and other systems; however most such detectors require many cycles of an alternating current (AC) input signal to determine a level of the input signal. Automatic Gain Control (AGC) circuits, circuits that adjust gain of an amplifier according to an amplitude of an incoming AC input signal, are also ubiquitous in radio and other systems, and require at least one amplitude detector to determine a level of the AC signal; again, most such circuits require many cycles of the incoming signal to determine changes in level of the signal and adjust gain of the amplifier to compensate for those changes.

SUMMARY

An amplitude detector has a 90-degree phase shifter, such as one using an analog differentiator and an adjustable gain stage or one using a determinable delay. The phase shifter is coupled to shift phase of an input signal to the amplitude detection apparatus. The detector also has a first analog multiplier coupled to square the input signal, a second analog multiplier coupled to square output of the phase shifter, and an analog adder coupled to sum outputs of the first and second analog multiplier.

BRIEF DESCRIPTION OF THE DRAWINGS

FIG. 4A and FIG. 4B illustrate block diagrams of alternative phase-shift networks for use in the fast amplitude detector or AGC circuit.

FIG. 5 is a schematic diagram of a power conditioning system using the present fast amplitude detector circuit.

DETAILED DESCRIPTION OF THE EMBODIMENTS

Hardware

Figure 1:
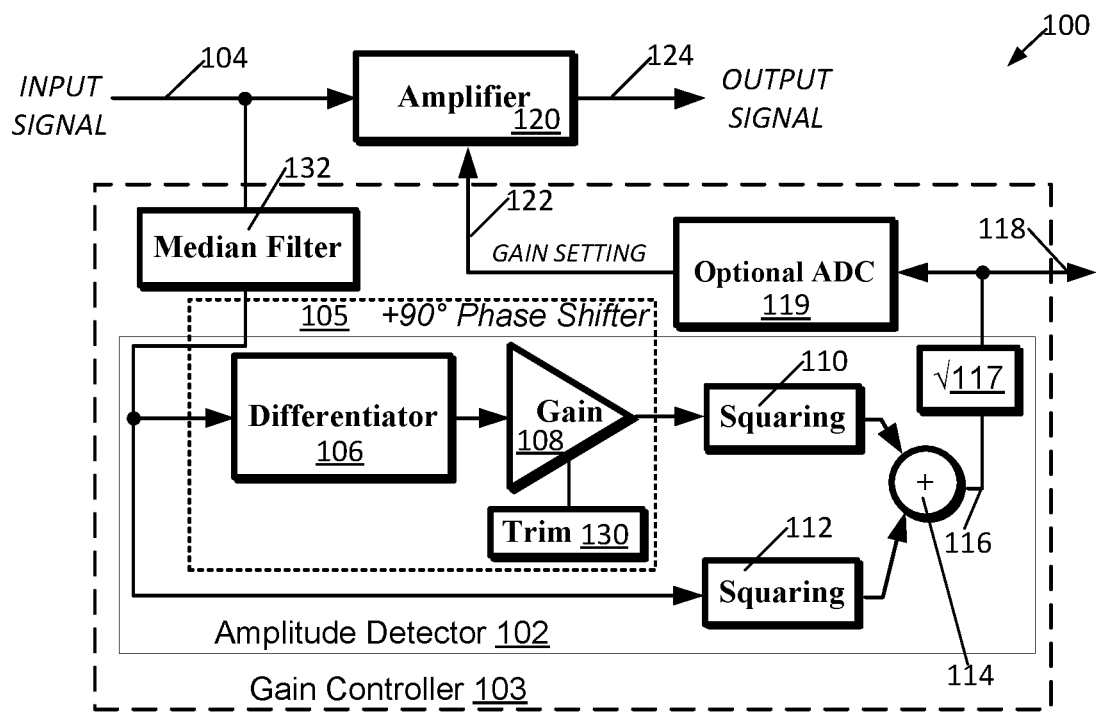
FIG. 1 is a block diagram of an automatic gain control circuit (AGC) of the present invention

A fast amplitude detection circuit 102 forming part of gain controller 103, and a fast-responding automatic gain control circuit 100 using the gain controller 103 and fast amplitude detection circuit 102, operates on a sinusoidal input signal 104.

The gain controller 103 may in some embodiments filter an input signal 104, the fast amplitude detection circuit 102 then phase-shifts the input signal 104 by 90 degrees in a phase-shift network 105. In an embodiment, phase-shift network 105 has a differentiator 106 and a gain stage 108 to perform the phase shift and adjust gain for frequency-dependent amplitude response of the differentiator, the phase-shifted and gain adjusted signal is then squared in an analog multiplier 110. In an alternative embodiment, phase-shift network 105 delays the input signal by one-quarter period to achieve a 90-degree phase shift, and the phase-shifted signal is squared in analog multiplier 110. The circuit also squares the un-phase-shifted input signal 104 in an analog multiplier 112. The squared input and squared phase-shifted signal are then summed in an analog adder 114 to provide a signal 116 representing a square of amplitude of the incoming signal 104. In some embodiments, a square root 117 of signal 116 is taken to provide a signal 118 directly proportional to amplitude of the input signal 104.

In some embodiments, where controllable amplifier 120 is digitally controlled or analog-to-digital conversion is used with the amplitude detection circuit in an automatic gain control circuit, an analog-to-digital converter 119, which may be a fast converter of the "Flash" type, is used to digitize the sum from adder 114 and provide a gain control signal 122 to controllable amplifier 120 in feed-forward configuration; in embodiments having analog gain control inputs, output of the adder 114 may provide gain control of a voltage controlled controllable amplifier 120 directly. In alternative embodiments, the input to amplitude detector 102 is taken from amplifier 120, and gain of the amplifier 120 is controlled in feedback configuration. Amplifier 120 provides an output 124 of the automatic gain controlled amplifier system.

The differentiator 106 of the phase shift network 105 has gain that is dependent on values of resistors and capacitors of the differentiator, as well as frequency of the input signal 104; a trim circuit 130 is provided to allow for adjustment of gain stage 108 of the phase-shift network to allow compensation for this variation. In a particular embodiment, where the amplitude detector 102 is fabricated on a monolithic integrated circuit for operation at fixed frequency, trim circuit 130 is adapted to be laser-trimmed, and when trimmed provides appropriate feedback resistances and reference current to current sources in gain stage 108 so gain stage 108 has to compensate for fabrication variations and to adjust gain stage 108 of the phase shift network to tune the phase shift network for a predetermined target frequency, such as an intermediate frequency (IF) of a communications receiver. In an alternative embodiment where the amplitude detector 102 is part of a system incorporating a processor (not shown) having a memory, the memory of the processor stores a calibration constant determined during a calibration procedure such as may be done during manufacture of the system. When the system starts operation, the processor writes the calibration constant to a register in trim circuit 130, trim circuit 130 then provides appropriate feedback resistances and reference current to current sources in gain stage 108 so the gain stage properly compensates the phase shift network for the predetermined target frequency, In a particular embodiment, where it is desired to adjust gain of a system rapidly for signal acquisition, but where amplitude of the input signal is not expected to change rapidly or at all, the amplitude detector 102 receives power from an on-chip power-enabling circuit and is turned off after gain settings have been assigned to the amplifier 120.

In another embodiment, in order to prevent response to high-voltage noise spikes, a noise-blanking or median filter 132 is provided and configured to suppress such noise spikes.

Figure 3:
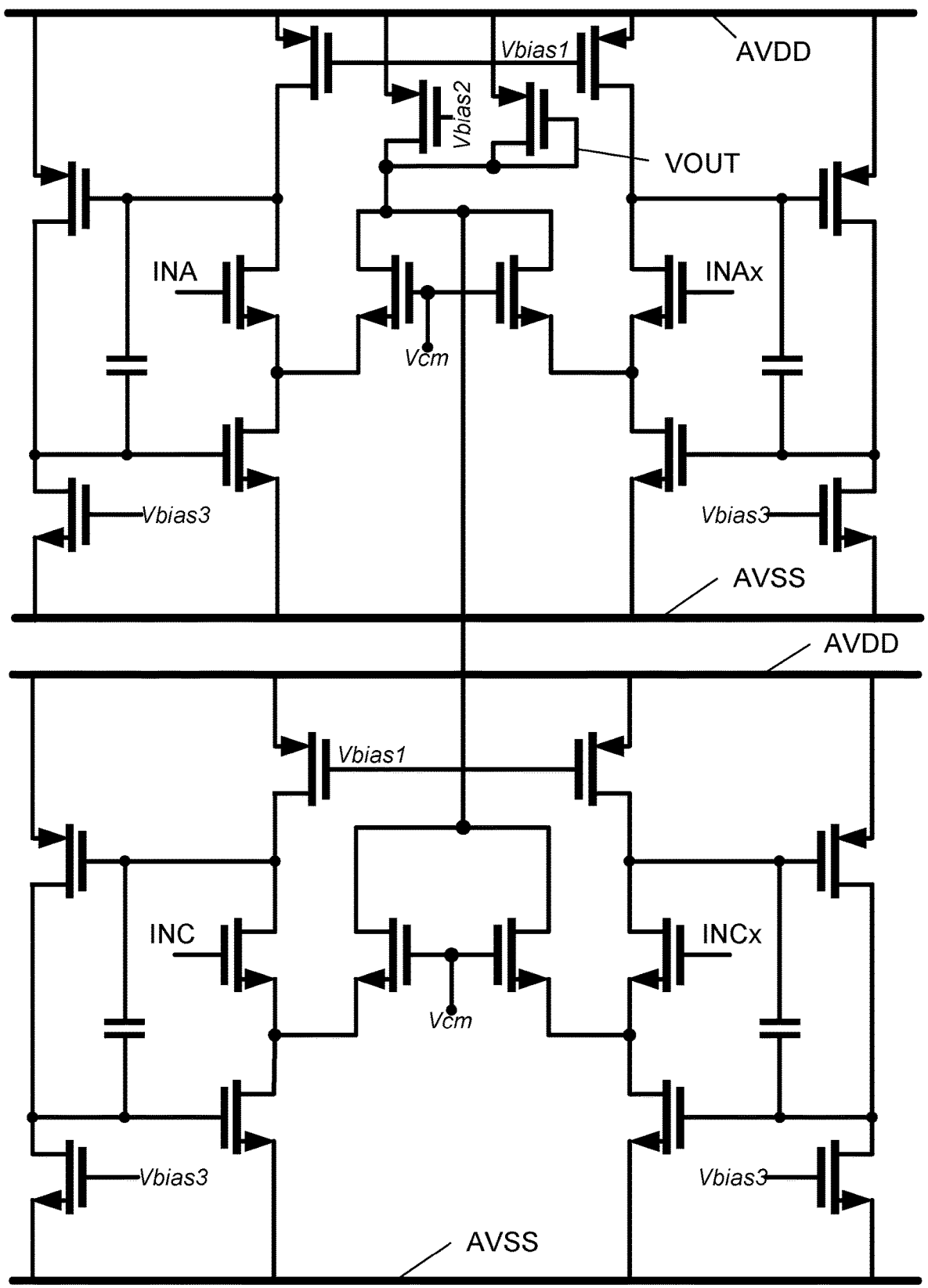
FIG. 3 is a schematic diagram of a fast amplitude detector circuit, as implemented in a CMOS integrated circuit process.

Alternative 90-degree phase-shift networks for use in the fast amplitude detector are illustrated in FIGS. 4A and 4B; since squaring is performed by the circuitry of squaring block 110 (FIG. 1) or the squaring-sum-and-root unit illustrated in FIG. 3 either the +90-degree phase shift of FIG. 4A or the −90-degree phase shift of FIG. 4B will function in the circuit.

Since a first derivative of a sine wave represents a frequency-dependent constant times a 90-degree phase-shifted derivative of the sine wave, the +90-degree phase shift of FIG. 4A uses a differentiator 402 such as often implemented by passing an input signal IN through a capacitor into an inverting input of an amplifier, with feedback taken through a resistor to the inverting input. To adjust for the frequency-dependent gain of differentiator 402, input signal IN is provided to a frequency detector 404; in fixed frequency embodiments or those where frequency is known, frequency detector 404 may be omitted or frequency identification provided from another source. Detected or externally-provided frequency 405 is provided through in some embodiments a ROM-based table 408 and DAC to control gain of a controllable-gain amplifier 410. Controllable-gain amplifier 410 amplifies differentiator 402 output, or an output of a noise filter 412 coupled to differentiator 402 output, by a factor determined to compensate for the frequency-dependent gain of differentiator 402 to provide phase-shifted output 418.

In the alternative embodiment 430 of the phase-shift network illustrated in in FIG. 4B, an all-pass filter 432 having a controllable delay delays input IN to provide output 436. In variable-frequency embodiments, a frequency detector 434 is provided to compensate gain of filter 432.

Theory

The present device performs an operation according to $$M = k(\text{cosine}(\emptyset)^2 + \text{sine}(\emptyset)^2)$$

Where M is a square of amplitude of the incoming signal, Ø is an instantaneous phase of the incoming signal, and k is a constant. By the Pythagorean theorem, an amplitude of the incoming signal is given as m=Square-Root(M).

In an alternative embodiment, an analog square-root circuit 117 is inserted into the amplitude detector immediately after analog adder 114 so that an output of the square-root circuit is linearly proportional to amplitude of the incoming signal.

Results Achieved (1) We designed, simulated, fabricated, and tested a fast amplitude detection circuit using data from a semiconductor foundry. A schematic diagram of squaring, summing, and square-rooting circuits of this circuit are shown in FIG. 3, where INA, INAx are a differential mode input corresponding to output of phase shifter 105 (FIG. 1), and INC, INCx is a differential mode input corresponding to output of median filter 132 (FIG. 1). On FIG. 3, AVSS is an analog ground, AVDD is an analog power supply, and VOUT is a summed and square-rooted magnitude signal corresponding to signal 118, signal directly proportional to amplitude of the input signal 104. Associated bias circuits are omitted for clarity.

(2) We designed an electronic readout front end system that uses the proposed fast amplitude detector.

The readout front end can process input signals within the amplitude range 1 mV to 1 V, and at frequencies of 100 Hz to 10 MHz, resolving amplitude within about one tenth of a cycle at low frequencies.

(3) Our results show that this read-out system is able to estimate the input amplitude and determine corresponding gain settings within a fraction of the input period, regardless of the input phase at time of amplitude change on the input.

(4) All of our circuits can be implemented by most analog or mixed-signal semiconductor processes and the design could easily adapt to become part of a larger "system on a chip."

Figure 2:
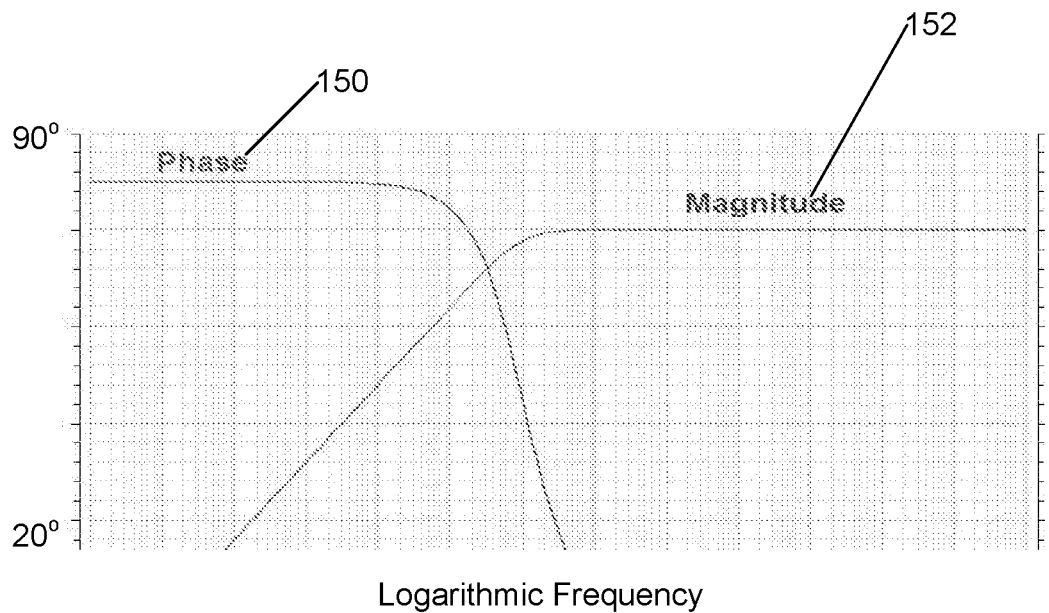
FIG. 2 is a phase versus magnitude plot for a differentiator-based phase shifter of the present design.

A particular embodiment of the system tuned for operation at 100 Hz has phase-shift 150 and amplitude 152 versus frequency response as illustrated in FIG. 2.

Applications

The fast amplitude detector and AGC system herein described can be used in many applications including controlling an intermediate frequency amplifier of a single or multiple-conversion superheterodyne receiver. It may also be used in a fast-response uninterruptable power supply, as illustrated in FIG. 5, or in an electrical-impedance imaging tomography system, as illustrated in FIG. 6.

In a fast-response uninterruptible power supply 550, a powerline-frequency (typically 50 or 60 Hz), AC 552 is received, typically through a mains connector 552. In normal operation, AC 552 couples through a fast solid-state transfer switch 554 to output 556, where it may be used to power computers and other sensitive electronic devices (not shown). AC 552 also couples to a fast amplitude detector 558, as herein described with reference to 102 on FIG. 1 to provide an amplitude signal 560, which is digitized by an ADC 562 or alternatively compared to limits (not shown), and digitized amplitude or out-of-tolerance signals provided to a processor 564. When processor 564 determines that a voltage drop-out occurs, such as when amplitude of AC 552 fails to meet requirements of the sensitive electronic devices, processor 564 trips transfer switch 554 to couple output 556 to a high-power DC-AC conversion amplifier 566 coupled to draw power from battery 568, and configures waveform synthesizer 570 to begin providing a reference waveform for amplifier 566 that begins in phase with AC 552; thereby providing power to a load connected to output 556. Using our fast amplitude detector, we expect uninterruptable power supply 550 output 556 to recover within a tenth of a cycle upon voltage dropouts on AC 152.

Figure 6:
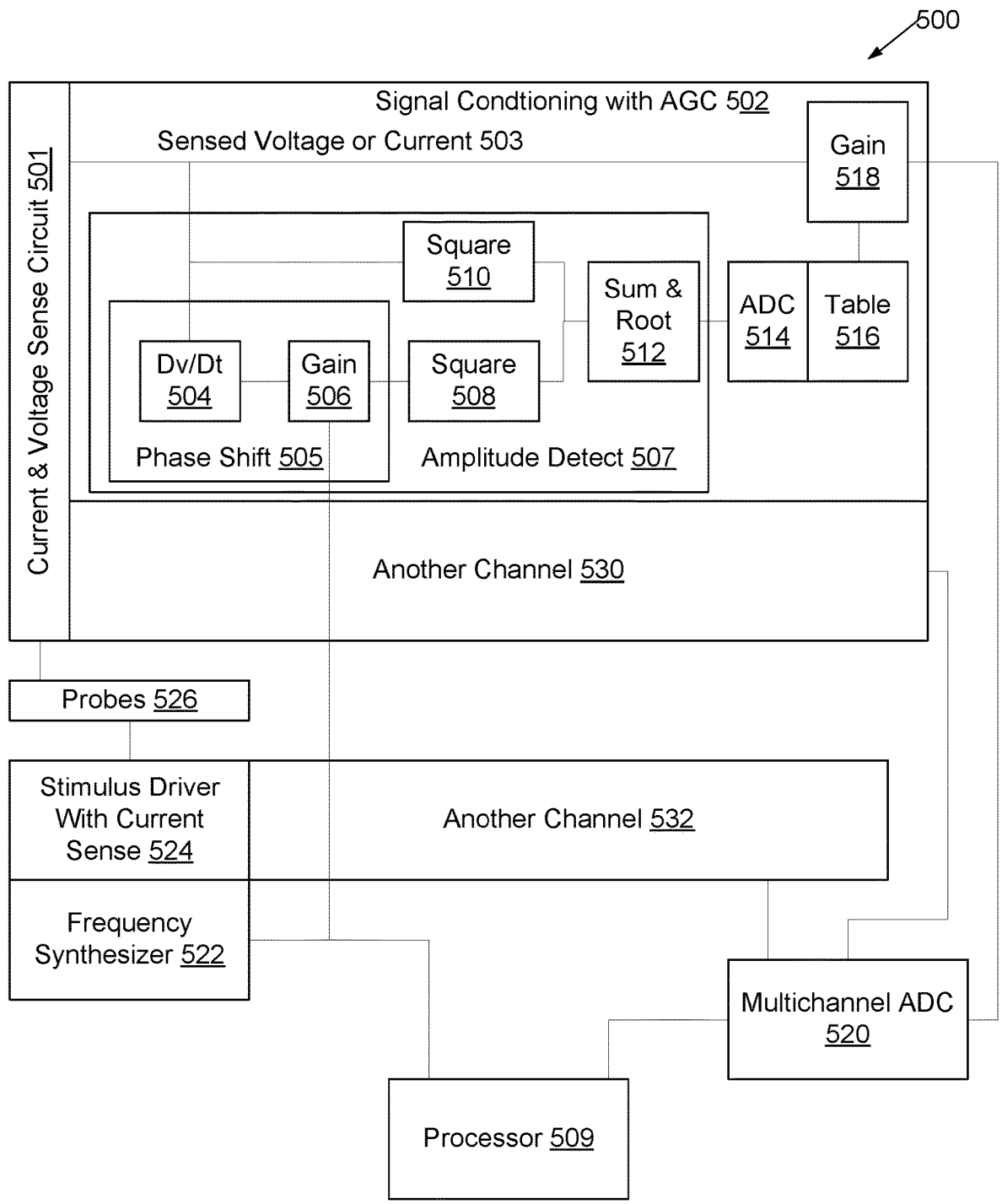
FIG. 6 is a block diagram of an electrical impedance tomography unit using the present AGC circuit.

The AGC unit herein described is also of use in an electrical impedance imaging system 500 as illustrated in FIG. 6. Each electrode or probe 526 of system 500 couples through voltage and current sensing circuit 501 to provide sensed voltage or current 503 to a signal conditioning with AGC block 502. Within signal conditioning with AGC block 502, sensed voltage or current 503 feeds an amplitude detector 507 having a 90-degree phase shifter 505 where it couples into differentiator 504. Differentiator 504 provides a first derivative signal to a gain block 506. Since frequency must be adjustable to match stimulus frequency, gain block 506 has an adjustable gain controlled by a processor 509 to a gain that compensates for frequency dependences of phase shifter 505. Phase shifter 505 gain block 506 provides output to a squaring circuit 508.

A second squaring circuit 510 is fed by sensed voltage or current 503, and outputs of both squaring circuits 508, 510 are summed and a square root extracted by sum & root unit 512. The extracted square root is processed by ADC 514 and table 516 to control gain of gain amplifier 518 that provides a multichannel ADC 520 with a conditioned signal derived from sensed voltage or current 503.

In system 500, processor 509 also controls frequency synthesizer 522 to provide a particular frequency of the multiple frequencies at which impedance is measured in sequence by system 500 to probe driver 524 for driving stimulus probes of probes 526. As there are multiple probes, additional copies 530, 532 of Signal Conditioning with AGC block 502 are provided to condition current and voltage signals for each probe of system 500. Processor 509 uses outputs of multichannel ADC, and knowledge of probe layout, to reconstruct a three-dimensional image of impedances within tissue of a patient.

Combinations

The various features herein described can be combined in several ways. For example, either phase shifter can be used for various applications with or without the A/D or table, and with the frequency detector or with other ways to identify frequency such as fixed frequency IF or programmable synthesizer devices. Particular anticipated combinations include:

An amplitude detection apparatus designated A including a phase shifter coupled to phase shift an input signal and an adjustable gain stage; a first analog multiplier coupled to square the input signal; a second analog multiplier coupled to square an output of the phase shifter; and an analog adder coupled to sum outputs of the first and second analog multiplier.

An amplitude detection apparatus designated AA including the amplitude detection apparatus designated A further comprising an analog square root circuit coupled to receive an output of the analog adder.

An amplitude detection apparatus designated AB including the amplitude detection apparatus designated A or AA wherein the amplitude detector is fabricated upon a monolithic integrated circuit, and further comprising trim circuitry adapted to compensate for manufacturing variation by adjusting gain of the gain stage of the phase shifter.

An automatic gain control circuit designated B including the amplitude detection apparatus designated A, AA, or AB coupled to control gain of a controllable amplifier.

An automatic gain control circuit designated BA including the automatic gain control circuit designated B wherein the controllable amplifier is digitally controlled, and further including: an analog-to-digital converter coupled to convert an analog output of the analog adder into a digital signal, the digital signal coupled to control the controllable amplifier.

An automatic gain control circuit designated BB including the automatic gain control circuit designated B or BA wherein the phase shifter comprises an all-pass filter delay unit.

An amplitude detection apparatus designated AC including the amplitude detection apparatus designated A, AA, or AB, wherein the phase shifter comprises an analog differentiator and an adjustable gain stage, the analog differentiator coupled to differentiate an input signal to the amplitude detection apparatus, the adjustable gain stage being configured to compensate for frequency dependent gain of the analog differentiator.

An amplitude detection apparatus designated AD including the amplitude detection apparatus designated A, AA, AB, or C further including an analog square root circuit coupled to receive an output of the analog adder.

An amplitude detection apparatus designated AE including the amplitude detection apparatus designated A, AA, AB, AC, or AD, wherein the amplitude detector is fabricated upon a monolithic integrated circuit, and further comprising trim circuitry adapted to compensate for manufacturing variation by adjusting gain of the gain stage of the phase shifter.

An automatic gain control circuit designated ABA including the amplitude detection apparatus designated A, AA, AB, AC, AD, or AE coupled to control gain of a controllable amplifier.

An uninterruptable power supply designated ACA including the amplitude detection apparatus designated A, AA, AB, AC, AD, or AE, wherein the uninterruptable power supply is configured to provide power from a battery to its output when the amplitude detection apparatus detects a dropout of an alternating-current power.

An electrical impedance imaging apparatus designated ADA including the automatic gain control circuit designated ABA coupled to condition voltage or current signals from electrodes of the electrical impedance imaging apparatus.

A method designated C of providing fast-response automatic gain control of an amplifier coupled to receive an input signal including phase-shifting the input signal to generate a phase-shifted input signal; squaring the phase-shifted input signal to provide a squared phase-shifted input signal; squaring the input signal to provide a squared input signal; summing the squared phase-shifted input signal and the squared input signal, and performing a square root to produce a magnitude signal; and using the magnitude signal to control gain of an amplifier coupled to amplify the input signal.

A method designated CA including the method designated C, further including compensating for frequency dependence of gain of the circuitry used to perform the phase shift.

A method designated CB including the method designated CA, wherein a frequency detection circuit is used to control the compensating for frequency dependence of gain of the circuitry used to perform the phase shift.

Conclusion

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

The invention claimed is:

1. A power conditioning system comprising:
an amplitude detector coupled to monitor an AC input and comprising:
a median filter coupled to receive the AC input signal and provide a filtered input signal,
a phase shifter comprising an adjustable gain stage, the phase shifter coupled to receive the filtered input signal, the phase shifter further comprising a differentiator coupled to differentiate the filtered input signal,
a first multiplier coupled to square the filtered input signal;
a second multiplier coupled to square an output of the phase shifter;
an adder coupled to sum outputs of the first and second multiplier, and
a square root circuit coupled to receive an output of the adder and provide an amplitude signal;
a fast transfer switch having a first configuration wherein the fast switch is coupled to power an AC output from the AC input;
a reference waveform generator; and
a battery coupled to power an amplifier, the amplifier coupled to amplify a waveform from the reference waveform generator to drive the AC output through the fast transfer switch when the amplitude signal indicates a voltage dropout on the AC input.

2. The power conditioning system of claim 1 wherein the reference waveform generator provides the waveform to the amplifier in phase with the AC input upon detection of the voltage dropout on the AC input.

3. The power conditioning system of claim 1 configured to respond to a voltage dropout on the AC input within a tenth of a cycle of the AC input.

4. The power conditioning system of claim 1 wherein the phase shifter further comprises an adjustable gain stage, the adjustable gain stage being configured by a processor of the power conditioning system to compensate for frequency dependent gain of the differentiator.

5. An electrical impedance imaging apparatus comprising:
a plurality of sense channels, each channel comprising an amplitude detection apparatus comprising:
a median filter coupled to receive an input signal and provide a filtered input signal,
a phase shifter comprising an adjustable gain stage, the phase shifter coupled to receive the filtered input signal,
the phase shifter further comprising a differentiator coupled to differentiate the filtered input signal,
a first multiplier coupled to square the filtered input signal,
a second multiplier coupled to square an output of the phase shifter,
an adder coupled to sum outputs of the first and second multiplier, and
a square root circuit coupled to receive an output of the adder and provide a control voltage fed forward to control gain of a controllable amplifier coupled to amplify the input signal
wherein the phase shifter further comprises an adjustable gain stage, the adjustable gain stage being configured by a processor of the amplitude detection apparatus to compensate for frequency dependent gain of the differentiator, and
coupled to a sense probe and coupled to provide amplitude signals;
the amplitude signals from the plurality of sense channels coupled to a processor;
the processor coupled to control a frequency synthesizer; and
the frequency synthesizer coupled through a plurality of probe drivers to driving probes.

6. The electrical impedance imaging apparatus of claim 5 wherein the processor is coupled to control gain of a variable-gain amplifier of the phase shifter of the amplitude detection apparatus of each sense channel.

7. The electrical impedance imaging apparatus of claim 6 wherein the processor controls gain of the variable-gain amplifiers of the phase shifters of the amplitude detection apparatus of the sense channels to compensate for frequency dependence of the phase shifters.

* * * * *